(12) United States Patent
Papamichail

(10) Patent No.: US 10,873,334 B1
(45) Date of Patent: Dec. 22, 2020

(54) LOW POWER SIGNAL GENERATOR

(71) Applicant: Dialog Semiconductor B.V., s-Hertogenbosch (NL)

(72) Inventor: Michail Papamichail, Eindhoven (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/256,408

(22) Filed: Jan. 24, 2019

(51) Int. Cl.
*H03L 7/099* (2006.01)

(52) U.S. Cl.
CPC .................. *H03L 7/0992* (2013.01)

(58) Field of Classification Search
CPC ........ H03K 23/00; H03K 23/44; H03K 23/54; H03K 23/544; H03K 23/667; H03L 7/00; H03L 7/0992; H03L 7/183
USPC ......................................................... 327/117
See application file for complete search history.

(56) References Cited

U.S. PATENT DOCUMENTS

| 9,391,623 | B1 * | 7/2016 | Friend | .................. | H03L 7/099 |
| 2018/0048263 | A1 * | 2/2018 | Yun | .................. | H03B 5/1243 |

OTHER PUBLICATIONS

"An Efficient Mixed-Signal 2.4-GHz Polar Power Amplifier in 65-nm CMOS Technology," IEEE Journal of Solid-State Circuit, vol. 46, No. 8, Aug. 2011, pp. 1796-1809.
"A Fully Integrated 2 × 1 Dual-Band Direct-Conversion Mobile WiMAX Transceiver With Dual-Mode Fractional Divider and Noise-Shaping Transimpedance Amplifier in 65 nm CMOS," by Jun Deguchi et al., IEEE Journal of Solid-State Circuits, vol. 45, No. 12, Dec. 2010, pp. 2774-2784.
"A 10 mW Bluetooth Low-Energy Transceiver With On-Chip Matching," by Jan Prummel et al., IEEE Journal of Solid-State Circuits, vol. 50, Issue: 12 , Dec. 2015, pp. 3077-3088.

* cited by examiner

*Primary Examiner* — Lincoln D Donovan
*Assistant Examiner* — Dave Mattison
(74) *Attorney, Agent, or Firm* — Saile Ackerman LLC; Stephen B. Ackerman

(57) ABSTRACT

A low power signal generator and a method for generating at least one source signal based on a reference signal having a reference frequency is presented. The signal generator has a divider circuit having a resonant frequency. The generator has an adjuster adapted to adjust the resonant frequency. The divider circuit has an input to receive the reference signal and an output for providing the source signal. The divider circuit is adapted to divide the reference frequency of the reference signal by a coefficient, such that the source signal has a source frequency that is less than the reference frequency.

18 Claims, 8 Drawing Sheets

LOW POWER SIGNAL GENERATOR

TECHNICAL FIELD

The present disclosure relates to a signal generator for generating a source signal. In particular, the present disclosure relates to a low power signal generator.

BACKGROUND

Frequency dividers are commonly used in the design and implementations of RF circuits, including RF communications circuits. In particular, they are a key component of phase-locked loop (PLL) circuits. Oscillators such as a voltage-controlled oscillator (VCO) or digitally-controlled oscillator (DCO) operate at high frequencies, often higher than the carrier frequencies of the communication standard. For example, the oscillator frequency may be twice the carrier frequency. These high frequencies are then divided down by an RF frequency divider to the desired carrier frequencies.

Using a high frequency VCO or DCO in combination with a frequency divider allows the creation of local oscillator signals which may be used for performing frequency modulation/demodulation when used together with an in-phase and quadrature (I/Q) modulator or demodulator; or for the creation of additional local oscillator signals with yet more phases. For example, a harmonic rejection mixer may require a plurality of local oscillators with a large number of phases.

Although the PLL block is part of the RF circuit, prior art frequency divider circuits are typically based on digital logic gate circuits. Logic based clock divider circuits require logic level input signals with stringent rise-time and fall-time characteristics. Since the controlled oscillator provides a sinusoidal low amplitude signal, a driver circuit is required to couple the oscillator with the logic-based clock divider circuit. Existing signal generators are limited by a relatively high power consumption and significant levels of electromagnetic interferences.

SUMMARY

It is an object of the disclosure to address one or more of the above-mentioned limitations. According to a first aspect of the disclosure, there is provided a signal generator for generating at least one source signal based on a reference signal having a reference frequency; the signal generator comprising a divider circuit having a resonant frequency; and an adjuster adapted to adjust the resonant frequency; wherein the divider circuit has an input to receive the reference signal and an output for providing the source signal, the divider circuit being adapted to divide the reference frequency of the reference signal by a coefficient, such that the source signal has a source frequency that is less than the reference frequency.

Optionally, the divider circuit is adapted to perform frequency division for a minimum amplitude value of the reference signal; and the adjuster is adapted to adjust the resonant frequency to reduce the minimum amplitude value.

For instance the minimum amplitude value of the reference signal may range from about 1 mV to about 500 mV.

Optionally, the adjuster is adapted to adjust the resonant frequency to a frequency substantially equal to the source frequency.

Optionally, the adjuster is adapted to generate a control signal to adjust the resonant frequency, and wherein the divider circuit has another input for receiving the control signal.

Optionally, the divider circuit comprises a tunable circuit adapted to vary the resonant frequency upon receipt of the control signal.

Optionally, the control signal may be a supply voltage, and the adjuster is adapted to generate the supply voltage to adjust the resonant frequency.

Optionally, the control signal may be a bias signal, wherein the adjuster comprises a bias circuit adapted to provide the bias signal. For instance, the bias signal may be a bias current or a bias voltage.

Optionally, the signal generator comprises a reference generator for generating the reference signal, wherein the reference generator is connected to the divider circuit.

Optionally, the divider circuit comprises an amplifier adapted to amplify the reference signal.

Optionally, the signal generator comprises a frequency sensor adapted to sense the source frequency.

Optionally, the adjuster has an input configured to receive an external signal to select an operation frequency; the control signal being configured to adjust the resonant frequency to the operation frequency.

Optionally, the adjuster comprises a register configured to store a list of operation frequencies.

Optionally, the divider circuit is adapted to provide a plurality of source signals, each source signal among the plurality of source signals having the same source frequency and a difference phase. For example, the plurality of source signals may include an in phase signal and a quadrature signal. Each source signal among the plurality of source signals may also have a different duty cycle. For example a 25% duty cycle, or a 33% duty cycle or a 50% duty cycle.

According to a second aspect of the disclosure, there is provided a transceiver comprising an antenna coupled to a receiver path and a transmitter path via an input-output interface; a reference generator for generating a reference signal having a reference frequency; and a signal generator for generating at least one source signal based on the reference signal; the signal generator comprising a first divider circuit having a first resonant frequency; and a first adjuster adapted to adjust the first resonant frequency; wherein the first divider circuit has an input to receive the reference signal and an output for providing the source signal, the first divider circuit being adapted to divide the reference frequency of the reference signal by a first coefficient, such that the source signal has a source frequency that is less than the reference frequency.

Optionally, the signal generator comprises a second divider circuit having a second resonant frequency; and a second adjuster adapted to adjust the second resonant frequency; wherein the second divider circuit has an input to receive the reference signal and an output for providing a second source signal, the second divider circuit being adapted to divide the reference frequency of the reference signal by a second coefficient, such that the second source signal has a source frequency that is less than the reference frequency.

Optionally, the first and second divider circuits are adapted to perform frequency division for a minimum amplitude value of the reference signal; and the first and second adjusters are adapted to adjust the first and second resonant frequencies to reduce the minimum amplitude value.

Optionally, the first divider circuit is coupled to a frequency mixer, the first divider circuit being adapted to provide at plurality of source signals to the frequency mixer.

Optionally, the transceiver comprises a phase-locked loop coupled to the reference generator and to the second divider.

The transceiver according to the second aspect of the disclosure may comprise any of the features described above in relation to the signal generator according to the first aspect of the disclosure.

According to a third aspect of the disclosure, there is provided a method of generating a source signal, the method comprising providing a reference signal having a reference frequency; providing a divider circuit having a resonant frequency, wherein the divider circuit has an input to receive the reference signal and an output for providing the source signal, feeding the reference signal to the divider circuit to obtain the source signal, such that the source signal has a source frequency that is less than the reference frequency; and adjusting the resonant frequency.

Optionally, the divider is adapted to perform frequency division for a minimum amplitude value of the reference signal; and the method comprises adjusting the resonant frequency to reduce the minimum amplitude value.

Optionally, the method comprises adjusting the resonant frequency to a frequency substantially equal to the source frequency.

The third aspect may share features of the first aspect as noted above and herein.

BRIEF DESCRIPTION OF THE DRAWINGS

The disclosure is described in further detail below by way of example and with reference to the accompanying drawings, in which.

DESCRIPTION

Figure 1:
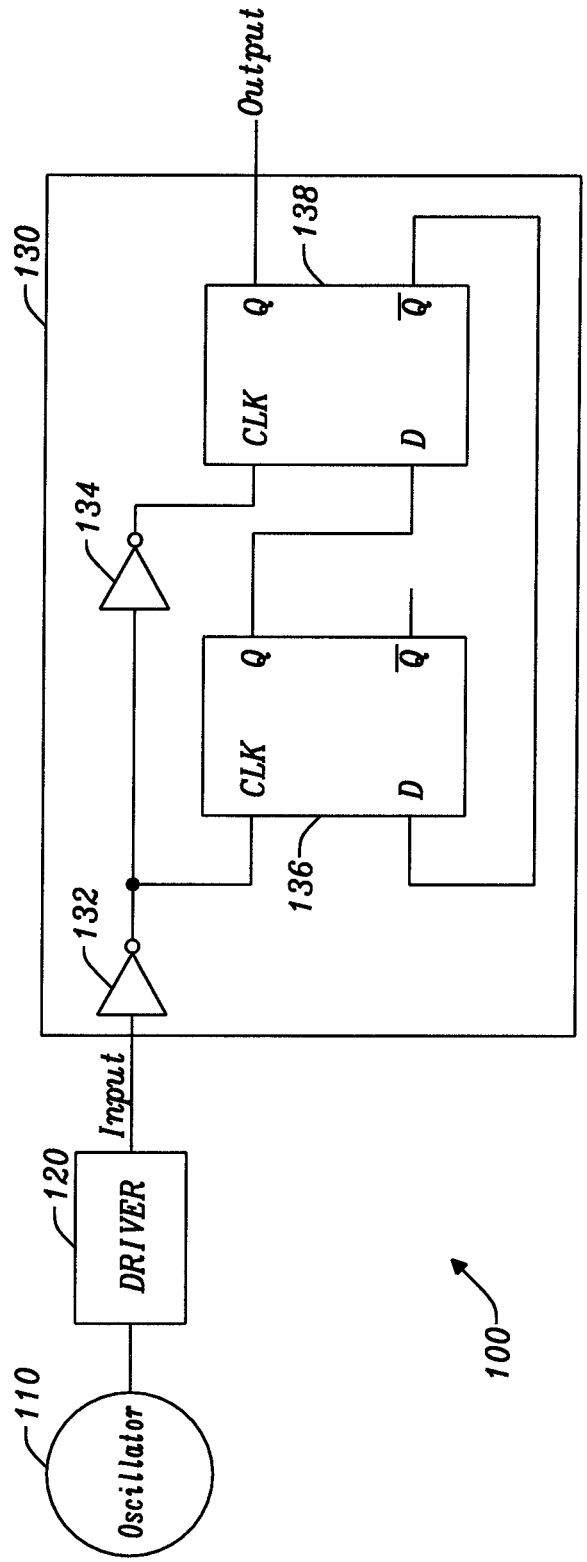
FIG. 1 is a conventional frequency divider circuit.

FIG. 1 illustrates a conventional circuit 100 for generating a source signal such as a clock or local oscillator signal. The circuit 100 includes an oscillator 110 for generating a reference signal with a reference frequency. For instance, the oscillator 110 may be a voltage-controlled oscillator VCO, or a digitally-controlled oscillator DCO. The oscillator 110 is coupled to an RF frequency divider 130 via a driver 120. The frequency divider 130 is a logic-based clock divider circuit that includes a first inverter, also referred to as a NOT gate 132, a second inverter 134, a first D flip-flop DFF 136 and a second D flip-flop 138. The first D flip-flop 136 is referred to as the master latch and the second D flip-flop 138 is referred to as the slave latch. The D-flip-flops 136 and 138 are configured in a negative feedback arrangement to form a toggle flip-flop. The first inverter 132 has an input connected to the driver 120 and an output connected to the input of the second inverter 134. Each D flip-flop includes two inputs and two outputs: a clock input CLK, a data input D, a first output Q and a second output $\overline{Q}$ that corresponds to the complement of the first output Q. The first D flip-flop 136 has its clock input coupled to the output of the first inverter 132, and its D input coupled to the second output $\overline{Q}$ of the second DFF 138. The output Q of the first D-flip flop 136 is coupled to the data input of the second D-flip flop 138. The second D-flip flop 138 has its clock input coupled to the output of the second inverter 134.

Figure 2:
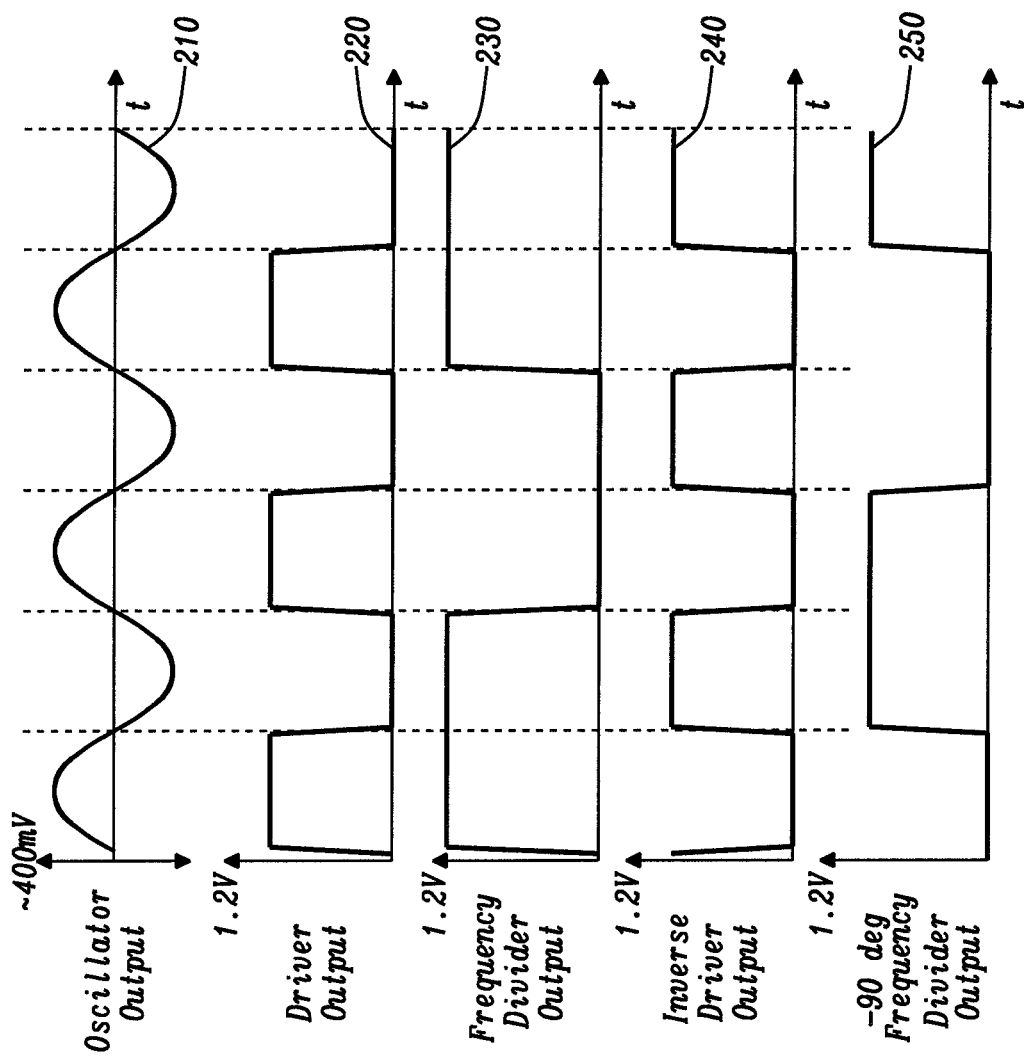
FIG. 2 is a time chart illustrating the working of the circuit of FIG. 1.

FIG. 2 is a time chart illustrating the working of the circuit 100 of FIG. 1. FIG. 2 shows the reference signal 210 provided by the oscillator 110, the output signal 220 provided by the driver 120 together with the inverse driver output signal 240, a first source signal 230 and a second source signal 250 provided by the frequency divider 130. The second source signal 250 corresponds to the first source signal 230 shifted by 90 degrees. The reference signal 210 has a relatively low amplitude, for instance the reference signal may be a sinusoidal signal with a peak amplitude of a few hundreds of millivolts. In this example, the reference signal 210 has an amplitude of 400 mV. The driver output signal 220 is 1.2 V hence three times larger than the amplitude of the reference signal.

In operation, the oscillator 110 provides the reference signal 210. The driver 120 amplifies the reference signal to provide a driver signal 220 that is compatible with the clock divider circuit 130. In other words, the signal 220 has the necessary signal characteristics needed by the logic-based frequency divider circuit 130. The first and second inverters 132 and 134 provide a first clock signal to the first D flip-flop 136 and a second clock signal to the second D flip-flop 138, respectively. The first and second clock signals are identical but with opposite phase.

In each clock cycle only one of the master latch 136 and the slave latch 138 is being activated. The driver output signal 220 is a square wave signal having for each period a rising edge (also referred to as positive edge) when the signal goes from low to high and a falling edge (also referred to as negative edge) when the signal goes from high to low. The frequency divider circuit 130 is rising-edge-triggered as it becomes active when the driver output signal 220 goes from low to high and ignores the high to low transition. On the negative edge of the driver output signal 220, the master latch 136 latches an input condition, while the slave latch 138 is deactivated, that is in its holding state. On the positive edge of the driver output signal 220, the slave latch 138 is now activated and latches on to the output of the master latch 136. So, the overall output of the clock divider 130 appears to be triggered on the positive edge of the driver output clock signal 220. On the next clock cycle, the output of the divider will toggle. The circuit 130 can also be referred to as toggle FF or T-FF circuit. This sequence repeats every two input clock periods; therefore, the output frequency of the source signal 230 is half the frequency of the reference signal 210 with a 50% duty cycle. The shifted signal 250 can be generated easily using the inverse of the driver output signal 240 together with a known reset state for the latches.

Figure 3:
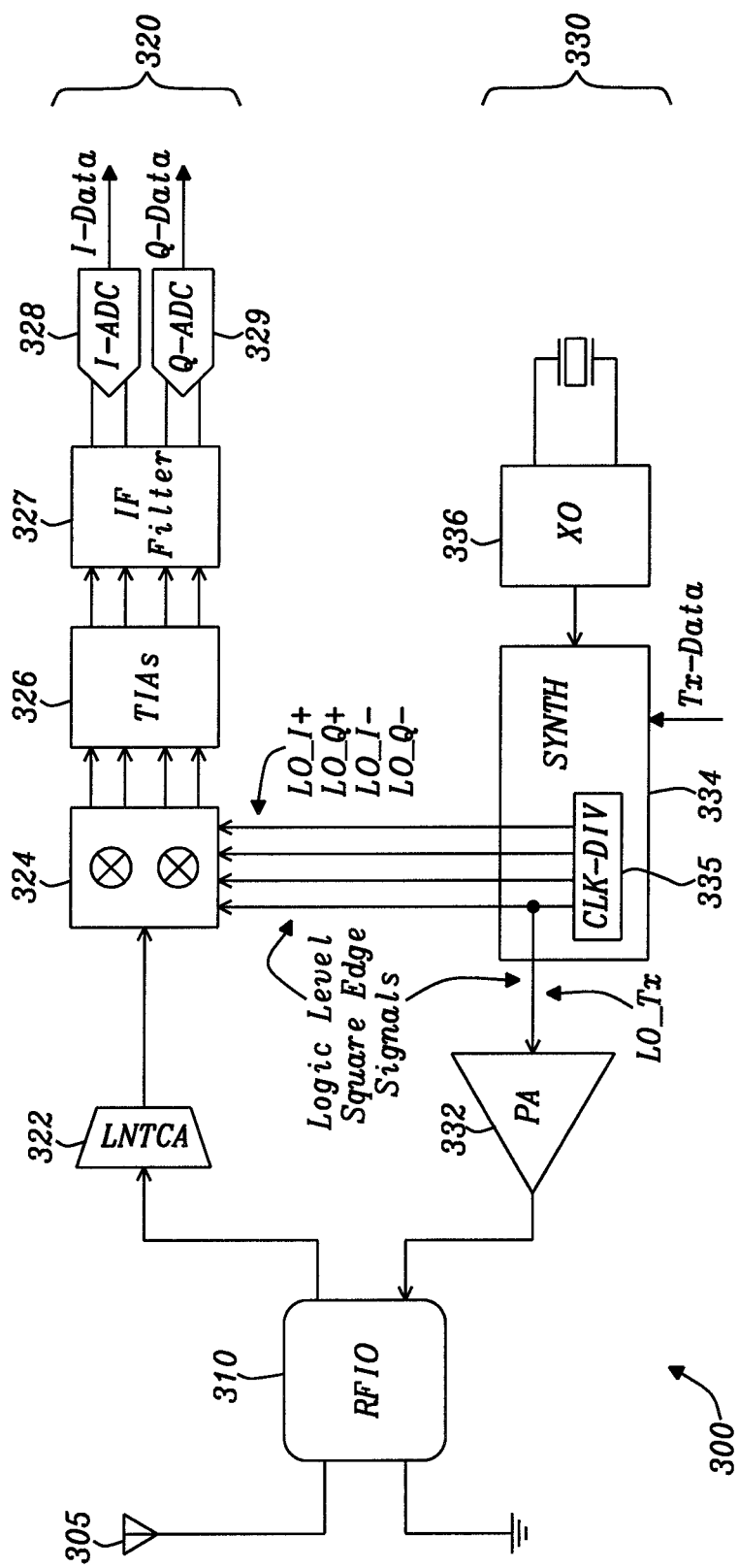
FIG. 3 is a conventional low power transceiver.

FIG. 3 illustrates a conventional low power transceiver 300. The transceiver 300 includes an antenna 305 coupled to a receiver path 320 and a transmitter path 330 via an RF input-output block 310. The receiver path 320 includes a low noise amplifier 322, a quadrature mixer 324, a current to voltage converter such as a transimpedance amplifier TIAs 326, a filter 327, a first analog to digital converter 328, also referred to as in-phase ADC and a second analog to digital converter 329, also referred to as quadrature ADC. The transmitter path 330 includes an oscillator 336, a frequency synthesizer 334, such as a phase-locked loop PLL synthesizer, and a power amplifier 332. The frequency synthesizer 334 includes a frequency divider 335 implemented as described with respect to FIG. 1. Some elements of the transmitter path are also common to the receiver path. For instance the oscillator 336 and the synthesizer 334 are used for both the transmitter path and the receiver path.

In operation, the frequency divider 335 generates four local oscillator signals LOs referred to as: LO_I+, LO_Q+, LO_I– and LO_Q–. In this example, four local oscillator signals are used by the receiver path 320, and one local oscillator is used by the transmitter path 330, however more local oscillators may also be used by the transmitter path. Since the receiver path 320 and the transmitter path 330 are physically separated from each other, a relatively long communication link is required between the output of the divider 335 and the quadrature mixer 324. In other words, the local oscillator signals generated by the frequency divider 335 have relatively long routing paths. The local oscillator signals have fast rise-times and fast fall-times. The combination of fast edge signals with the long routing path increases the probability of electromagnetic interferences. This in turn degrades the radio performance for both the receiver path 320 and the transmitter path 330. In addition, routing logic level signals requires a system of drivers that ensures proper logic level signal integrity. This increases power consumption of the RF sub-system.

Furthermore, the long routing lines and the plurality of logic level drivers introduce mis-matches between the four local oscillator phases. This negatively affects all the figures of merit that depend on the symmetry of the phases between the local oscillator signals, for instance, image rejection and second order linearity. Even if the divider 335 were to be placed closer to the circuit to be driven, logic level drivers would still be required hence increasing power consumption. When considering a low power transceiver, using an oscillator providing a low amplitude reference signal, the design of the logic level driver poses several challenges. In this case, the logic level driver is a high frequency amplifier, for instance, two times the local oscillator frequency, and as such it needs to provide a high enough gain to achieve logic level output while still meeting tight duty cycle requirements as well as balance requirements and noise requirements. Due to those constraints, the logic level driver has a power consumption that is in the same order as the power consumption of the oscillator.

Figure 4:
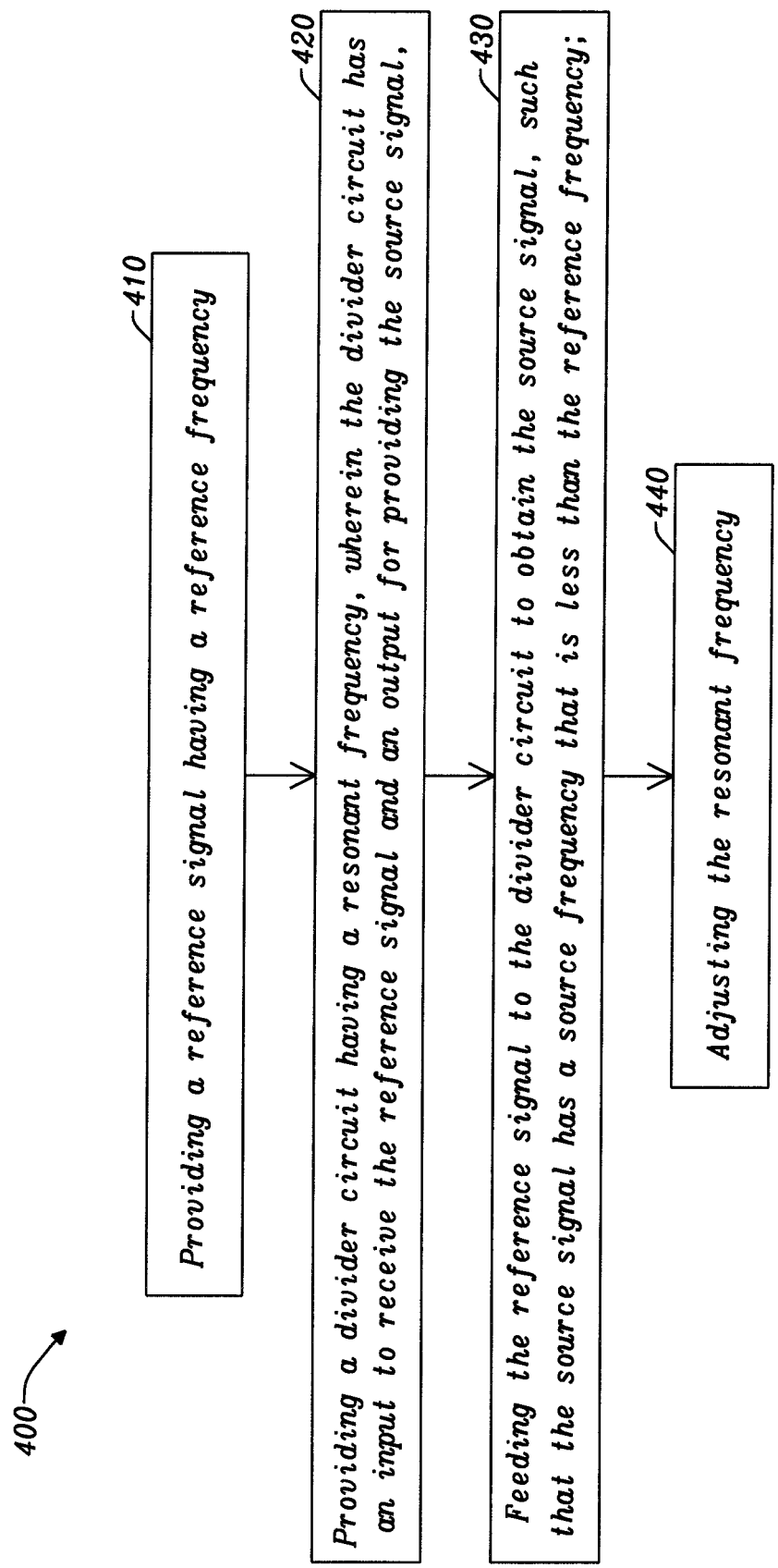
FIG. 4 is a flow chart of a method for generating a source signal according to the disclosure.

FIG. 4 is a flow-chart of a method 400 for generating a source signal. The method comprises the following steps. At steps 410, a reference signal having a reference frequency is provided. For example, the reference signal may be a sinusoidal signal. The reference signal may be provided by an oscillator to provide a reference signal with a well-defined frequency, such as a voltage-controlled oscillator or a digitally-controlled oscillator. At step 420, a divider circuit having a resonant frequency is provided, the divider circuit having an input to receive the reference signal and an output for providing the source signal. The divider circuit may be implemented in different fashions. For instance, the divider circuit may be a logic-based circuit. At step 430 the reference signal is fed to the divider circuit to obtain the source signal, such that the source signal has a source frequency that is less than the reference frequency. For instance, the source frequency may be 1/N the reference frequency in which N is an integer greater than 1. At step 440 the resonant frequency is adjusted. The divider may be adapted to perform frequency division for a minimum amplitude value of the reference signal; and the resonant frequency may be adjusted to reduce the minimum amplitude value. For instance, the resonant frequency may be adjusted to a frequency substantially equal to the source frequency.

The method 400 is not limited to any particular sequence of events as the steps of the method may be implemented in various order. Additional intermediate steps may also be included in the method. The adjustment of the resonant frequency at step 440 may take place at any time, hence with the reference signal being applied to the divider circuit or not. For instance the resonant frequency of the divider may be adjusted while the divider is not driven by the reference signal. Alternatively, the resonant frequency adjustment may take place when the divider is driven by the reference signal. This may be achieved by setting the reference signal to a chosen frequency with a relatively small amplitude, and sweep the resonant frequency, for instance using a frequency controller providing a control signal to the divider. Then a plot of the source frequency may be obtained to identify for which continuous range of resonant frequency control values a correct output source frequency is achieved. A control value may be chosen in the middle of that range.

Figure 5:
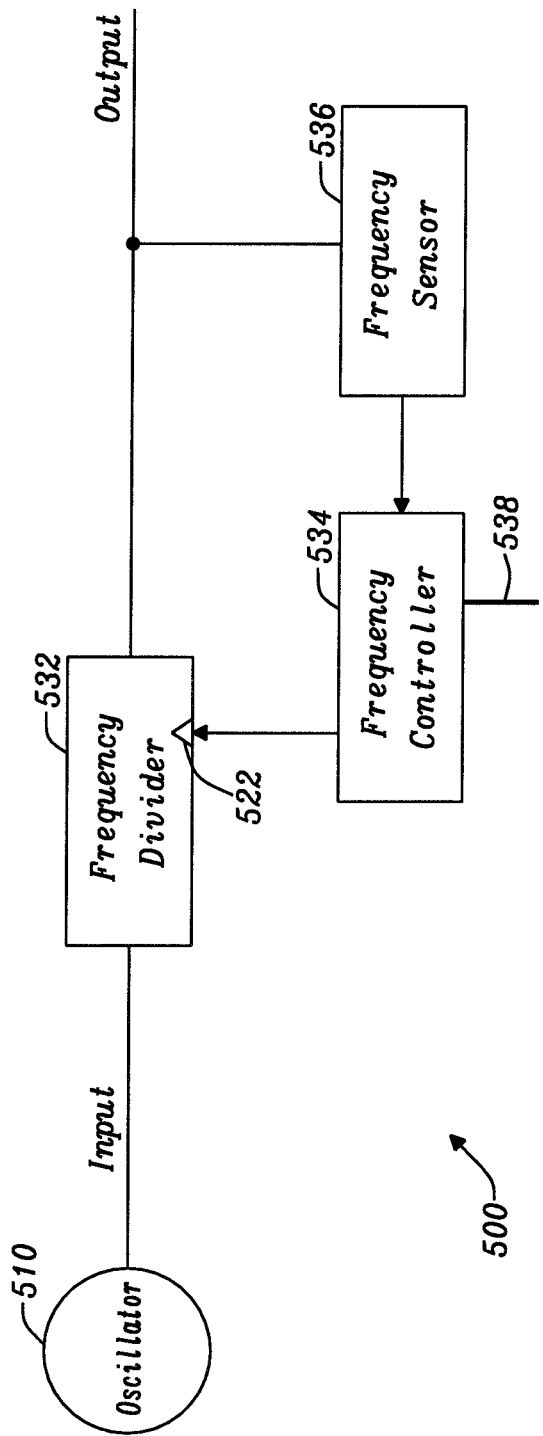
FIG. 5 is a diagram of a signal generator for implementing the method of FIG. 4.

FIG. 5 is a diagram of a signal generator for providing a source signal according to the disclosure. For instance, the source signal may be a local oscillator signal or a clock signal. The circuit 500 includes a reference signal generator such as a controlled oscillator 510. The reference signal generator may be an ultra-low power oscillator providing a reference signal having a peak amplitude that is lower than a threshold voltage of a transistor. For instance the peak amplitude may range from about 100 mV to about 500 mV. The reference signal generator 510 is coupled to a frequency divider 532 having a resonant frequency. A frequency controller 534, also referred to as adjuster is provided for adjusting the resonant frequency of the frequency divider circuit. A frequency sensor 536 may be provided to sense the frequency of the source signal provided at the output of the divider. It will be appreciated that the frequency sensor 536 and the frequency controller 534 may be integrated in a single device. The divider 532 has two inputs: a first input for receiving the reference signal from the oscillator 510 and a second input, also referred to as frequency input 522 for receiving a control signal from the adjuster 534.

The adjuster or frequency controller 534 has a first input coupled to the output of the divider 532 and an output for providing the control signal to the divider. Optionally, the adjuster 543 may also have a second input to receive an operation frequency signal from another device. The frequency divider 532 may include various logic stages to divide the frequency of the reference signal. For instance, the source frequency may be 1/N the reference frequency in which N is an integer greater than 1.

The frequency divider 532 may be designed to resonate in a range that includes a desired operation frequency. The resonant frequency of the divider 532 may vary due to process variation in the way the circuit was manufactured, and/or by changes in external conditions such as temperature, and supply voltages. The resonant frequency may be adjusted to compensate for these variations by implementing a fixed constant correction factor, or by monitoring the resonant frequency of the circuit and adjusting it accordingly, for instance by implementing a feedback loop. Such adjustments may be provided systematically or periodically as part of a calibration process.

The second input 522 of the divider 532 may be adapted to receive a supply voltage from the adjuster 534. By changing the supply voltage, the resonant frequency of the divider 532 may be adjusted. Alternatively the second input 522 may be a separate bias input adapted to receive a bias from the adjuster 534. By changing this additional bias the divider may be operated slower or faster, hence changing its resonant frequency. For instance, the frequency controller 534 may include a bias circuit for providing a bias voltage or a bias current. The bias circuit may be programmable so as to adjust the resonant frequency of the divider 532 to the desired frequency. Alternatively, or in combination the frequency controller may include a programmable voltage supply. In yet another embodiment, the frequency controller may re-use parts of an on-chip PLL.

The frequency divider 532 may include an internal circuit also referred to as tunable self-resonance circuit to adjusts the resonant frequency of the divider 532 based on the control signal received from the frequency controller 534. The frequency divider 532 may also include an amplifier to increase the amplitude of the reference signal. If necessary the amplifier may be used to amplify a low amplitude reference signal at the resonant frequency of the circuit, so that the reference signal reach the minimum threshold amplitude required for the divider to operate properly.

The frequency controller 534 may also include a terminal 538 for receiving an external signal. The external signal may be a signal for identifying an operation frequency. A choice of operation frequency may vary depending on the application. For instance, the frequency divider 532 may be implemented as part of a radio system or a transmitter. In this scenario, the operation frequency may be based on a clock frequency requirement of the radio system. The frequency controller 534 may also include a register that stores a list of operation frequencies. When the frequency controller receives the external signal at its input terminal 538, it may then select a particular operation frequency and send a control signal to the frequency divider 532 to change the resonant frequency. The circuit 500 may be modified to generate a plurality of source signals, each signal having a same frequency but different phases. In this case the circuit 500 may be referred to as a multi-phase signal generator.

In operation, the oscillator 510 provides a reference signal having a reference frequency. The reference signal is received directly at the input of the frequency divider 532. The divider 532 performs frequency division of the input reference signal. For instance, if the reference signal has a frequency of 5 GHz, and the divider divides by a factor N=2, then the frequency divider provides an output signal also referred to as source signal having a frequency of 2.5 GHz. The divider 532 performs the frequency division when the input signal that it receives has a minimum threshold amplitude value. The frequency sensor 536 senses the frequency of the source signal and communicates the source signal frequency to the frequency controller 534. In turn, the frequency controller generates a control signal to adjust the resonant frequency of the frequency divider 532. The control signal is received at the second input 522 of the frequency divider. By adjusting the resonant frequency of the frequency divider 532, the minimum amplitude value of the reference signal can be reduced. For instance the frequency controller 534 may send a control signal to adjust the resonant frequency to a frequency substantially equal to the source frequency. Compared with the circuit of FIG. 1, the signal generator of FIG. 5 does not require any driver. The oscillator is connected directly to the input of the frequency divider 532 and the resonant frequency of the divider circuit 532 is set to the desired self-resonant frequency. This reduces the power consumption of the circuit and limit interferences.

Figure 6:
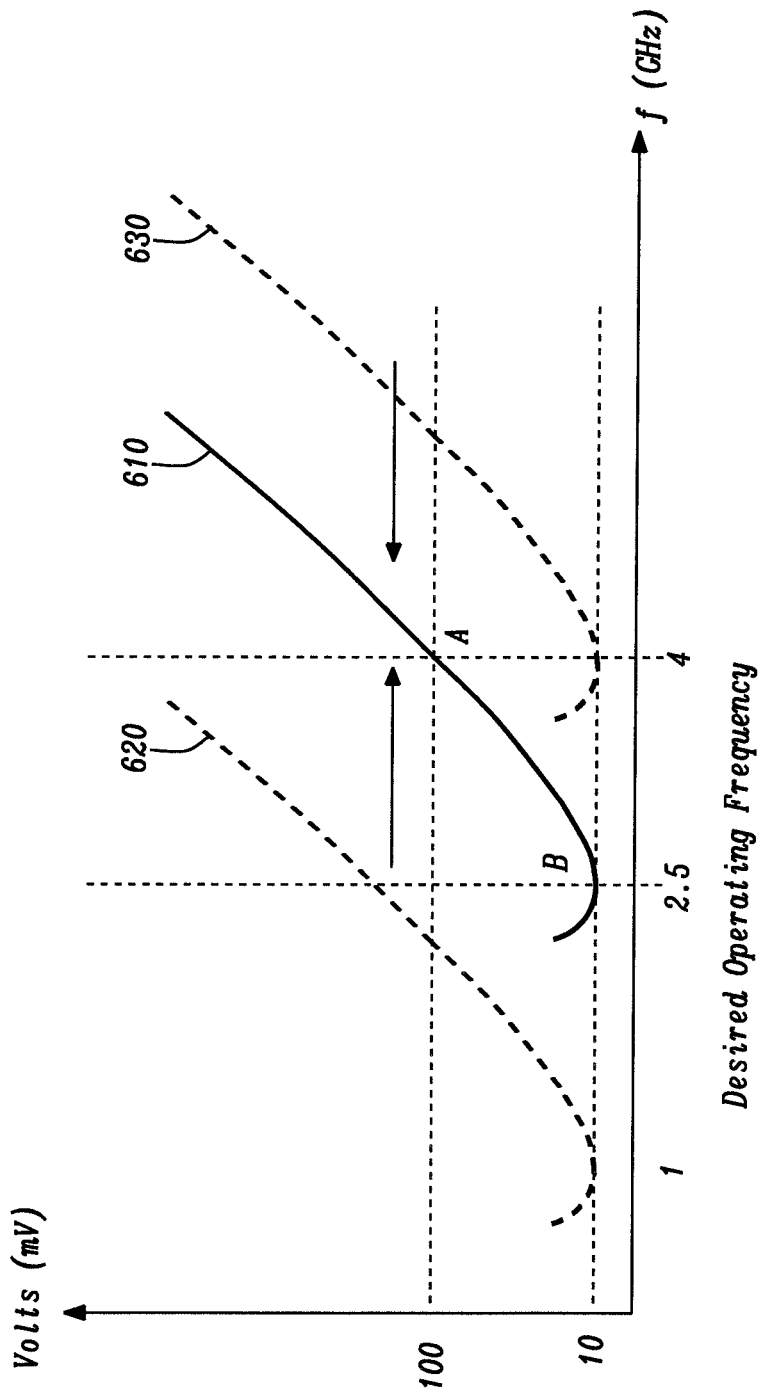
FIG. 6 is a plot of a required amplitude of a reference input signal for use with the signal generator of FIG. 5.

FIG. 6 illustrates the minimum required amplitude of the reference signal provided by the reference generator. FIG. 6 shows three curve profiles obtained for three different frequencies of the source signal provided by the divider. The curve 610 shows the minimum amplitude of the reference signal for a source frequency of 2.5 GHz; curve 620 shows the minimum amplitude of the reference signal for a source frequency of 1 GHz; and curve 630 shows the minimum amplitude of the reference signal for a source frequency of 4 GHz.

The divider "self-oscillates" at a given resonant frequency. In order for the divider to perform frequency division the input reference signal must have a minimum required amplitude. The minimum required amplitude varies as a function of frequency. For instance if the divider divides an input frequency by a factor N=2, and if the input reference signal has a frequency of 5 GHz, then the output signal of the divider is a source signal having a source frequency of 2.5 GHz. The curve 610 shows that if the divider circuit has a resonant frequency of 4 GHz, then the required minimum amplitude of the input signal is 100 mV (point A), however if the resonant frequency is 2.5 GHz then the minimum amplitude is only 10 mV (point B). Hence, by adjusting the resonant frequency of the divider to 2.5 GHz (the output frequency of the divider), the minimum amplitude required by the input reference signal has been reduced. More generally, by choosing the resonant frequency of the divider to be close or equal to the frequency of the source signal, the minimum required amplitude of the input reference signal is reduced.

Figure 7:
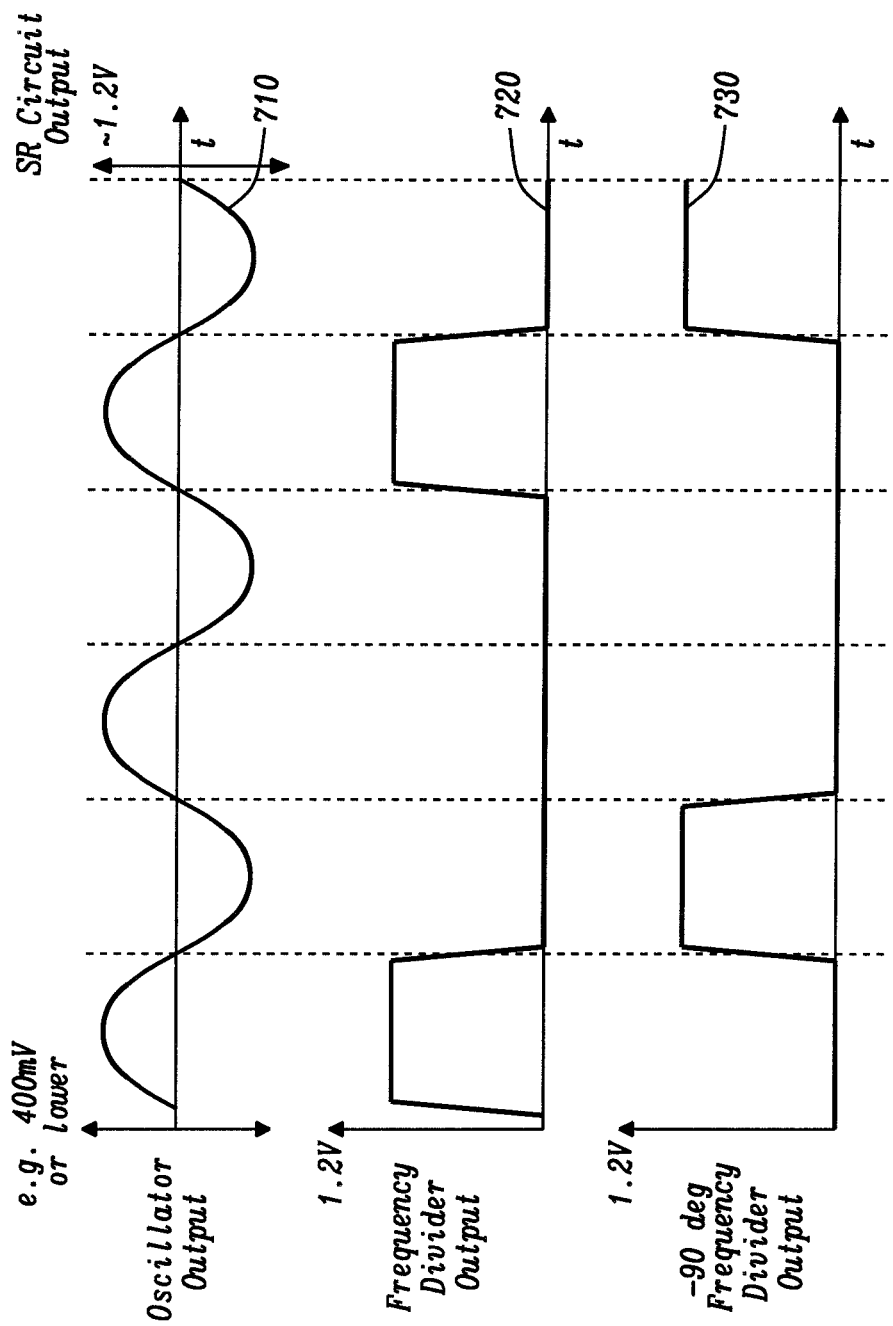
FIG. 7 is a time chart illustrating the working of the circuit of FIG. 5.

FIG. 7 is a time chart illustrating the working of the frequency divider of FIG. 5. FIG. 7 shows the reference signal 710, a first source signal 720, and a second source signal 730 provided by the frequency divider. The first and second source signals 720 and 730 are shifted by 90 degrees. The reference signal 710 is a sinusoidal signal with a relatively low amplitude, in this example 400 mV peak value. The reference signal 710 may be amplified. In this example the reference signal has been amplified to reach a peak value amplitude of 1.2V. The frequency divider 532 provides a first source signal 720 having a frequency that is 1/N the reference frequency of the reference signal 710. In this example, N=2 and the source signal 720 is shown as a square wave signal with a 25% duty cycle. The second source signal 730 is phase shifted with respect to the first source signal 720. The first and second source signals 720 and 730 could be used in a multi-phase clocking system, such as an IQ receiver.

Figure 8:
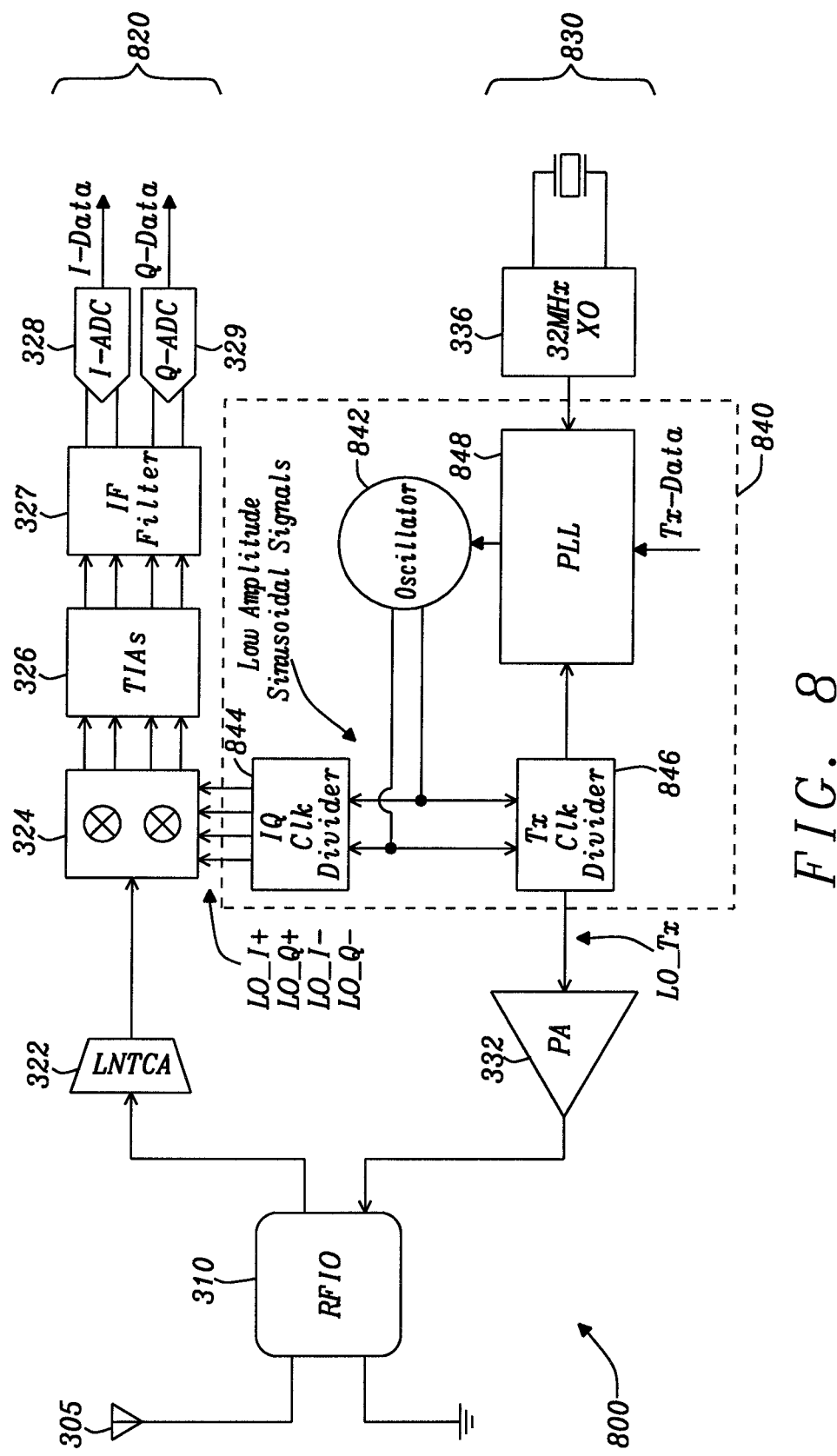
FIG. 8 is a low power transceiver provided with a signal generator according to FIG. 5.

FIG. 8 illustrates a low power transceiver 800 according to the disclosure. FIG. 8 shares similar components to those illustrated in FIG. 3. The same reference numerals have been used to represent corresponding components and their description will not be repeated for the sake of brevity. The circuit 800 includes a receiver path 820 and a transmitter path 830. Compared with the circuit 300 of FIG. 3, the frequency synthesizer 334 has now been replaced by the synthesizer circuit 840. The circuit 840 includes an oscillator 842, such as a digitally-controlled oscillator, coupled to a phase-locked loop PLL 848, a first clock divider 846 also referred to as a transmitter clock divider and a second clock divider 844 referred to as IQ clock divider. The clock dividers 844 and 846 may be implemented as shown in FIG. 5 above. Some elements of the transmitter path are also common to the receiver path. For instance the oscillator 842 and the synthesizer 840 are used for both the transmitter path 830 and the receiver path 820.

The PLL 848 has three inputs and one output. A first input for receiving transmission data, a second input for receiving a reference signal from oscillator 336, a third input for receiving a clock signal from the clock divider 846 and one output coupled to the oscillator 842. The oscillator 842 is coupled to the respective inputs of both the first clock divider 844 and the second clock divider 846. In this example, the oscillator 842 provides a differential output. The first clock divider 844 provides four local oscillator signals, referred to as LO_I+, LO_Q+, LO_I− and LO_Q− which are received by the Q-multiplexer 324. Similarly, the output of the clock divider 846 is received by the power amplifier 332. The clock dividers 846 and 844 are therefore provided near the circuits being driven, in this case close to the components 324 and 332. There is also no need for logic level drivers as a result. Compared with the transceiver 300, the transceiver 800 has lower interferences, lower noise characteristics and a lower power consumption.

A skilled person will appreciate that variations of the disclosed arrangements are possible without departing from the disclosure. For instance, the signal generator according to the disclosure may be used with various frequency scaling and/or multi-phase generation system. Accordingly, the above description of the specific embodiment is made by way of example only and not for the purposes of limitation. It will be clear to the skilled person that minor modifications may be made without significant changes to the operation described.

The invention claimed is:

1. A signal generator for generating at least one source signal based on a reference signal from a reference generator; the signal generator comprising
    a divider circuit having a resonant frequency; and
    an adjuster adapted to generate a control signal to adjust the resonant frequency of the divider circuit;
    wherein the divider circuit has a first input to receive the reference signal, a second input to receive the control signal and an output for providing the source signal, the divider circuit being adapted to divide a reference frequency of the reference signal by a coefficient, such that the source signal has a source frequency that is less than the reference frequency,
    wherein the divider circuit is adapted to perform frequency division for a minimum amplitude value of the reference signal; and wherein the adjuster is adapted to adjust the resonant frequency reduce the minimum amplitude value.

2. The signal generator as claimed in claim 1, wherein the adjuster is adapted to adjust the resonant frequency to a frequency substantially equal to the source frequency.

3. The signal generator as claimed in claim 1, wherein the divider circuit comprises a tunable circuit adapted to vary the resonant frequency upon receipt of the control signal.

4. The signal generator as claimed in claim 1, wherein the control signal is a supply voltage, and wherein the adjuster is adapted to generate the supply voltage to adjust the resonant frequency.

5. The signal generator as claimed in claim 1, wherein the control signal is a bias signal, wherein the adjuster comprises a bias circuit adapted to provide the bias signal.

6. The signal generator as claimed in claim 1, comprising the reference generator for generating the reference signal, wherein the reference generator is connected to the divider circuit.

7. The signal generator as claimed in claim 1, wherein the divider circuit comprises an amplifier adapted to amplify the reference signal.

8. The signal generator as claimed in claim 1, comprising a frequency sensor adapted to sense the source frequency.

9. The signal generator as claimed in claim 1, wherein the adjuster has an input configured to receive an external signal to select an operation frequency; the control signal being configured to adjust the resonant frequency to the operation frequency.

10. The signal generator as claimed in claim 1, wherein the adjuster comprises a register configured to store a list of operation frequencies.

11. The signal generator as claimed in claim 1, wherein the divider circuit is adapted to provide a plurality of source signals, each source signal among the plurality of source signals having the same source frequency and a difference phase.

12. A transceiver comprising
    an antenna coupled to a receiver path and a transmitter path via an input-output interface;
    a reference generator for generating a reference signal having a reference frequency; and
    a signal generator for generating at least one source signal based on the reference signal; the signal generator comprising a first divider circuit having a first resonant frequency; and a first adjuster adapted to generate a first control signal to adjust the first resonant frequency of the first divider circuit; wherein the first divider circuit has a first input to receive the reference signal, a second input to receive the first control signal and an output for providing the source signal, the first divider circuit being adapted to divide the reference frequency of the reference signal by a first coefficient, such that the source signal has a source frequency that is less than the reference frequency, wherein the first divider circuit is adapted to perform frequency division for a minimum amplitude value of the reference signal; and wherein the first adjuster is adapted to adjust the first resonant frequency to reduce the minimum amplitude value.

13. The transceiver as claimed in claim 12, wherein the signal generator comprises a second divider circuit having a second resonant frequency; and a second adjuster adapted to generate a second control signal to adjust the second resonant frequency of the second divider circuit; wherein the second divider circuit has a first input to receive the reference signal, a second input to receive the second control signal and an output for providing a second source signal, the second divider circuit being adapted to divide the reference frequency of the reference signal by a second coefficient, such that the second source signal has a source frequency that is less than the reference frequency.

14. The transceiver as claimed in claim 13, wherein the second divider circuit is adapted to perform frequency division for a minimum amplitude value of the reference signal; and wherein the second adjusters is adapted to adjust the second resonant frequency to reduce the minimum amplitude value.

15. The transceiver as claimed in claim 12, wherein the first divider circuit is coupled to a frequency mixer, the first divider circuit being adapted to provide at plurality of source signals to the frequency mixer.

16. The transceiver as claimed in claim 13 comprising a phase-locked loop coupled to the reference generator and to the second divider.

17. A method of generating a source signal, the method comprising
    providing a reference signal having a reference frequency;
    providing an adjuster to generate a control signal;

providing a divider circuit having a resonant frequency, wherein the divider circuit has a first input to receive the reference signal, a second input to receive the control signal, and an output for providing the source signal, feeding the reference signal to the divider circuit to obtain the source signal, such that the source signal has a source frequency that is less than the reference frequency; and adjusting the resonant frequency of the divider circuit using the control signal;

wherein the divider circuit is adapted to perform frequency division for a minimum amplitude value of the reference signal; and wherein the method comprises adjusting the resonant frequency to reduce the minimum amplitude value.

18. The method as claimed in claim 17, comprising adjusting the resonant frequency to a frequency substantially equal to the source frequency.

\* \* \* \* \*